(12) United States Patent
Mahoney et al.

(10) Patent No.: US 7,180,318 B1
(45) Date of Patent: Feb. 20, 2007

(54) MULTI-PITCH TEST PROBE ASSEMBLY FOR TESTING SEMICONDUCTOR DIES HAVING CONTACT PADS

(75) Inventors: David M. Mahoney, Palo Alto, CA (US); Mohsen Hossein Mardi, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 6 days.

(21) Appl. No.: 10/966,917

(22) Filed: Oct. 15, 2004

(51) Int. Cl.
*G01R 31/26* (2006.01)
(52) U.S. Cl. .................. 324/761; 324/765; 324/754
(58) Field of Classification Search ........ 324/761–762, 324/765, 158.1, 763; 438/14–18; 439/482, 439/824; 257/686, 700
See application file for complete search history.

(56) References Cited

U.S. PATENT DOCUMENTS

| 4,686,464 | A | * | 8/1987 | Elsasser et al. ............. 324/761 |
| 5,307,010 | A | * | 4/1994 | Chiu ........................... 324/766 |
| 5,554,940 | A | * | 9/1996 | Hubacher ................... 324/765 |
| 6,292,003 | B1 |   | 9/2001 | Fredrickson et al. |
| 6,359,456 | B1 | * | 3/2002 | Hembree et al. ............ 324/754 |
| 6,443,745 | B1 |   | 9/2002 | Ellis et al. |
| 6,456,099 | B1 | * | 9/2002 | Eldridge et al. ............ 324/754 |
| 6,530,148 | B1 |   | 3/2003 | Kister |
| 6,615,485 | B2 |   | 9/2003 | Eldridge et al. |
| 6,639,420 | B1 |   | 10/2003 | Chen et al. |
| 6,661,244 | B2 |   | 12/2003 | McQuade et al. |
| 6,727,714 | B2 |   | 4/2004 | Deguchi |

OTHER PUBLICATIONS

U.S. Appl. No. 10/703,836, filed Nov. 7, 2003, Mahoney.
U.S. Appl. No. 10/842,770, filed May 11, 2004, Mardi et al.

* cited by examiner

*Primary Examiner*—Vinh P. Nguyen
(74) *Attorney, Agent, or Firm*—Marc R. Ascolese; Robert Brush

(57) ABSTRACT

Die probing devices can include multiple sets of probe wires, where certain probe wires correspond to test pads and other correspond to bond pads. The probe wires can be electrically coupled to each other using either a space transformer or a probe card, to provide appropriate continuity. Probe wires can generally be arranged in numerous different patterns depending upon (for example) pad layout, wire configuration, wire type, and probe head design/manufacturing constraints.

24 Claims, 2 Drawing Sheets

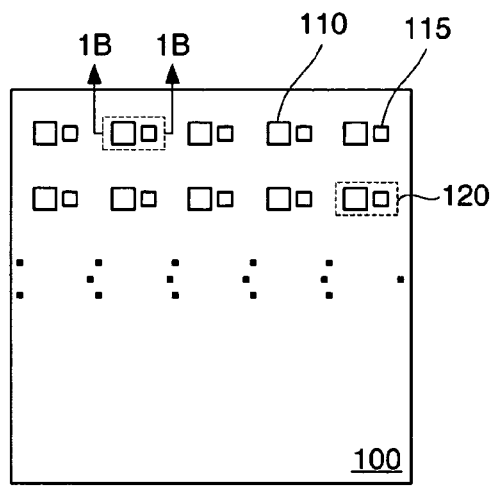
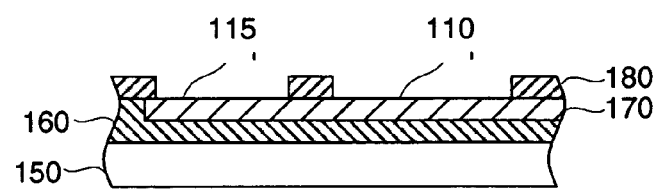
FIG. 1A  FIG. 1B
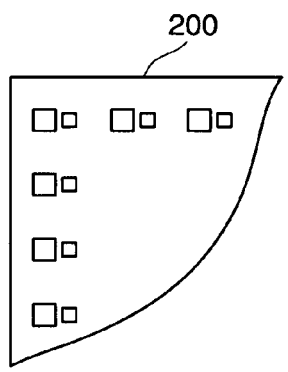
FIG. 2A
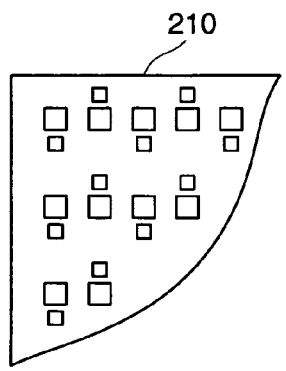
FIG. 2B
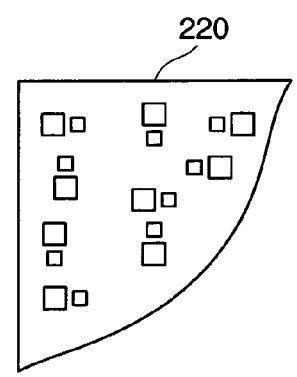
FIG. 2C

MULTI-PITCH TEST PROBE ASSEMBLY FOR TESTING SEMICONDUCTOR DIES HAVING CONTACT PADS

TECHNICAL FIELD

The present invention relates to testing of semiconductor devices, and more particularly to testing devices having vertical probes and used to test semiconductor devices having contact pads.

BACKGROUND

Integrated circuit die are typically coupled to their packaging using one of several different techniques. In the case of wire bonding, the integrated circuit die is attached to a chip carrier or substrate using either an organic conductive adhesive or a solder. Then, small wires are attached (using electrical current or ultrasonic energy) between contact pads on the die and contact pads on the chip carrier using a wire bonding tool. The die is attached to the carrier face up, then a wire is bonded first to the die, then looped and bonded to the carrier. Wires can be several mm in length, and 25–35 µm in diameter.

An increasingly popular die-to-package bonding technique is to use flip chip technology. Flip chip is not a specific package or even a package type (like BGA), rather it describes the method of electrically connecting the die to the package carrier. The package carrier, either substrate or lead frame, then provides the connection from the die to the exterior of the package. The interconnection between the die and carrier in flip chip packaging is made through conductive bumps that are placed directly on the die surface. The bumped die is then flipped over and placed face down, with the bumps connecting to the carrier directly. A bump is typically 70–100 µm high, and 100–125 µm in diameter. The flip chip connection is generally formed one of two ways: using solder or using conductive adhesive. The solder bumped die is attached to a substrate by a solder reflow process, very similar to the process used to attach BGA balls to the package exterior. After the die is soldered, underfill is added between the die and the substrate. The chip attach and underfill steps are the basics of flip chip interconnect. Beyond this, the remainder of package construction surrounding the die can take many forms and can generally utilize existing manufacturing processes and package formats.

Certain substrate, device, and processing defects inevitably lead some of the integrated circuit die to be "bad" (i.e., not fully functional). Because of the high cost of cutting integrated circuit wafers into individual die, packaging the die, and testing the packaged integrated circuit, integrated circuit die are typically tested before being mounted on the supporting substrate. Die testing typically involves using a testing device or probe to make a plurality of discrete connections to the bond pads or bump contacts on the die and providing test signals (e.g., power and data signals) to the integrated circuit. Unfortunately, such physical contact between test probe and die can cause damage to the bond pads and/or bumps. This damage may ruin a die or in extreme cases an entire wafer.

One solution to this problem is to include both bond pads (i.e., pads to which bumps will be attached) and separate test pads for one or more of the bond pads. Each test pad is in electrical communication with a respective one of the bond pads. The substrate is tested using the test pads or some combination of test pads and bond pads. Thus, a testing device can contact the test pads without contacting the bond pads, avoiding the aforementioned damage. Examples of such solutions can be found in the U.S. patent application entitled "Semiconductor Component Having Test Pads and Method and Apparatus for Testing Same," Ser. No. 10/842,770, naming M. H. Mardi et al., as inventors, and filed on May 11, 2004, ("the '770 application") which is hereby incorporated by reference herein in its entirety.

Unfortunately, conventional die probing devices, e.g., existing vertical or cantilever probe cards, are not designed for use with dies including both bond and test pads. Accordingly, it is desirable to have die probing devices configured for use with integrated circuit dies having both bond pads and associated test pads.

SUMMARY

In one exemplary embodiment a die probing devices can include multiple sets of probe wires, where certain probe wires correspond to test pads and other correspond to bond pads. The probe wires can be electrically coupled to each other using either a space transformer or a probe card, to provide appropriate continuity. Probe wires can generally be arranged in numerous different patterns depending upon (for example) pad layout, wire configuration, wire type, and probe head design/manufacturing constraints.

Accordingly, one aspect of the present invention provides an apparatus including a substrate, a first plurality of probe wires coupled to the substrate, and a second plurality of probe wires coupled to the substrate. The first plurality of probe wires are arranged with respect to the substrate to correspond to a first plurality of pads of an integrated circuit. The second plurality of probe wires are arranged with respect to the substrate to correspond to a second plurality of pads of the integrated circuit. The first plurality of pads of the integrated circuit are test pads, and the second plurality of pads of the integrated circuit are bond pads.

Another aspect of the present invention provides a method. A first probe wire is contacted with a first pad of an integrated circuit die. A second probe wire is contacted with a second pad of the integrated circuit die. The first pad of an integrated circuit die is a test pad, the second pad of an integrated circuit die is a bond pad, and the test pad is electrically coupled to the bond pad.

Another aspect of the present invention provides an apparatus including: a means for contacting a first probe means with a first pad of an integrated circuit die; and a means for contacting a second probe means with a second pad of the integrated circuit die; wherein the first pad of the integrated circuit die is a first test pad or a first bond pad, wherein the second pad of the integrated circuit die is a seond test pad or a second bond pad, and wherein the first test pad is electrically coupled to the first bond pad.

The foregoing is a summary and thus contains, by necessity, simplifications, generalizations and omissions of detail;

consequently, those skilled in the art will appreciate that the summary is illustrative only and is not intended to be in any way limiting. As will also be apparent to one skilled in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

A more complete understanding of the present invention and advantages thereof may be acquired by referring to the following description and the accompanying drawings, in which like reference numbers indicate like features.

FIGS. 1A–1B illustrate plan and cross-sectional views, respectively of an integrated circuit die including both bond pads and test pads.

FIGS. 2A–2C illustrate several different bond pad and test pad configurations.

FIGS. 6A–5E illustrate several examples of different types of test pins that can be used with the present invention.

DETAILED DESCRIPTION

Figure 3:
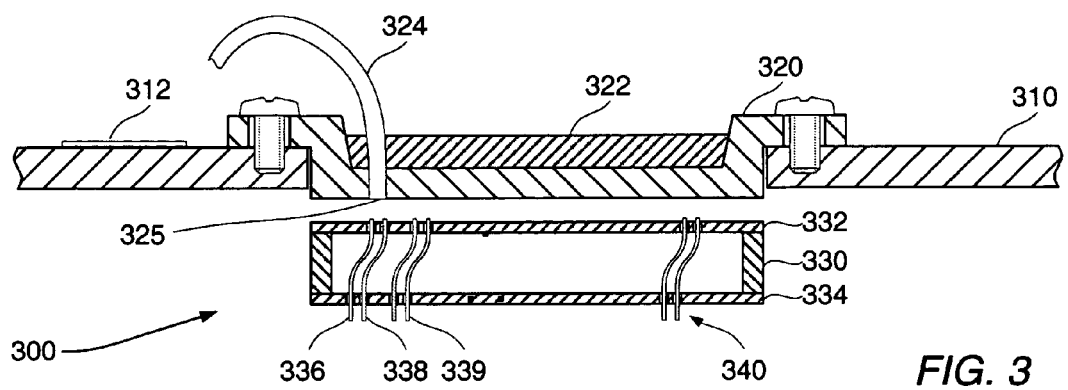
FIG. 3 illustrates a cross-sectional view of one embodiment of the present invention.

The following sets forth a detailed description of at least the best contemplated mode for carrying out the one or more devices and/or processes described herein. The description is intended to be illustrative and should not be taken to be limiting.

FIG. 1A is a plan view depicting an integrated circuit die 100 having multiple bonding pads 110 and corresponding test pads 115. Thus, a set of related pads 120 typically includes both a bond pad and a test pad. The pads in such a set are typically coupled electronically (as will be described below in connection with FIG. 1B) so that there is continuity between the pads. Integrated circuit die 100 can be fabricated using any known fabrication technique, and has a desired circuitry configuration. For example, integrated circuit die 100 can include a processor (e.g., a microprocessor or digital signal processor), memory (e.g., dynamic random access memory (DRAM), static RAM (SRAM), or flash memory), programmable logic (e.g., a field programmable gate array (FPGA) or a complex programmable logic device (CPLD)), a mask-programmable logic device (e.g., application specific integrated circuit (ASIC) or application specific standard product (ASSP)), or like-type integrated circuit devices known in the art. While integrated circuit die 100 is shown as being generally rectangular in shape, those skilled in the art will appreciate that other shapes may be utilized.

FIG. 1B is a cross-sectional view of a portion of integrated circuit die 100 of FIG. 1A taken along the line 1B—1B of FIG. 1A. The cross-section 1B—1B illustrates a single test/bond pad pair. In the example illustrated, various integrated circuit die contacts (e.g., bond pad 110' and test pad 115') are exposed by openings within die passivation layer 180.

Die passivation layer 180 comprises an electrically insulating material, such as an oxide (e.g., silicon dioxide ($SiO_2$)), a glass (e.g., borophosphosilicate glass (BPSG)), a polymer (e.g., polyimide), or like-type insulation material known in the art. Bond pad 110', test pad 115', and die passivation layer 180 are disposed on a circuit-side of integrated circuit die 100, with the bond pads and test pads disposed below the level of the die passivation layer.

Integrated circuit die 100 includes a top conductor layer 170 in electrical communication with various semiconductor devices (semiconductor circuits) fabricated on integrated circuit die 100. As shown, conductor layer 170 forms the basis of the various bond and test pads. Integrated circuit die 100 can also include an internal conductor portion 160 comprising one or more internal conductor layers between a substrate portion 150 (e.g., a silicon wafer substrate) and the top conductor layer 170. All of the conductor layers may be separated by respective insulating layers, and may be connected to each other using vias or other interconnect structures (not shown for simplicity).

The conductors of top conductor layer 170 and the internal conductor portion 160 may be formed using a conventional semiconductor fabrication process, which may include a deposition process. Suitable materials for the conductors of top conductor layer 170 and the internal conductor portion 160 include, for example, aluminum, chromium, titanium, nickel, iridium, copper, gold, tungsten, silver, platinum, tantalum, molybdenum, as well as alloys of such metals. Passivation layer 180 is formed over top conductor layer 170. Top conductor layer 170 electrically couples bond pad 110' with test pad 115' (e.g., the top conductor layer 170 electrically couples the bond pad 110' with the test pad 115'). As shown, each of bond pads is laterally separated from a respective test pad by a portion of the passivation layer 180. Thus, test pad 115' may be considered an "extended pad" or "extended test pad" with respect to bump pad 110'.

As noted above, bond pads (110 and 110') are adapted to support bumped contacts (e.g., solder balls) for providing external electrical connections for the integrated circuit die. Once the bumped contacts are in place, the integrated circuit die can be flip chip mounted to mating electrodes on a supporting substrate, such as a circuit board or lead-frame. After mounting, the integrated circuit die is typically packaged or encapsulated to form an integrated circuit (e.g., ball grid array (BGA) package, chip scale package (CSP), and like-type packages known in the art). As described below, test pads (115 and 115') can be used to test the integrated circuit die before it is bumped and without necessarily contacting bond pads.

Bond pads 110 and test pads 115 can be generally square as illustrated in FIG. 1A, or can have other shapes as desired and known in the art (e.g., other polygonal, circular, or elliptical shapes). Moreover, bond pads 110 and test pads 115 can have the same shape as each other (as shown) or can have different shapes. Similarly the separation of the two types of pads and the relative orientation of the two types of pads can be arbitrarily selected as desired. As shown in FIG. 1A, the pads can be located across the surface of integrated circuit die 100 following a regular pattern and having a regular pitch. In other examples, as illustrated in FIGS. 2A–2C, different patterns, both regular and irregular can be used. Thus, for example, integrated circuit die 200 possesses a perimeter pad pattern, integrated circuit die 210 possesses an array bond pad pattern with alternating locations for test pads, and integrated circuit die 220 possesses an irregular pad layout. Moreover, all bond pads need not have a corresponding test pad, and in some cases a bond pad can have multiple associated test pads. Thus, the size, shape, number, and layout of such pads can vary from implementation to implementation.

FIG. 3 illustrates a cross-sectional view of one embodiment of the present invention. More specifically, vertical pin probing device 300 includes a printed circuit test board 310 (sometimes referred to as a "probe card") having conductive traces 312 which are connected in a test circuit relationship to integrated circuit test equipment (not shown). In practice, conductive traces 312 (on the surface of probe card 310 as shown and/or within the PCB layers forming probe card 310) lead to other contacts, e.g., pogo pads, on the printed circuit board to which the external test equipment leads are connected in a prescribed test.

Vertical pin probing device 300 also includes space transformer 320 and probe head assembly 330. Space transformer 320 mounts onto the probe card 310 and routes electrical signals between the circuit board and a plurality of wire probes (e.g., 336 and 338) included in probe head assembly 330. Because the probe assembly and the space transformer are not permanently mounted (soldered) to the circuit board or each other, either one can be readily changed out for offline rework or repair without causing significant downtime in the testing process. Generally, space transformer 320 permits a plurality of resilient contact structures in the probe head assembly 330 to make contact with terminals of an electronic component (i.e., bond pads on semiconductor devices) at a relatively fine pitch (spacing), while connections between space transformer 320 and probe card 310 are effected at a relatively coarser pitch. As will be seen in the examples of FIGS. 3 and 4, the space transformer can be implemented in a number of ways (using various different fabrication technologies).

Space transformer 320 includes a well formed therein, at the bottom of which a number of holes are laid out to correspond to a pattern of exposed probe wires (336 and 338) of the probe head assembly 330. Probe head assembly 330 is shown separated from the space transformer 320 for clarity, but is typically connected to space transformer 320 using screws or some other fastener (not shown). An individual wire 324 is typically connected to a probe card conductive trace 312 at one end, while the other end extends into a hole at the base of space transformer 320 so as to be in electrical contact with probe wire 336 and/or probe wire 338.

Probe wire 338 is shown in FIG. 3 using dashed lines because in at least one embodiment, a particular probe head assembly location corresponding to wire 324 has only one or the other of probe wires 336 and 338. For example, probe head assembly 330 can include some locations corresponding to space transformer wires where only a test pad probe wire is located (e.g., 336), and other locations corresponding to space transformer wires where only a bond pad probe wire is located (e.g., 339). In other embodiments, one or more locations in the probe head assembly will have both types of probe wire, e.g., probe wire pair 340 (corresponding space transformer wire not shown). In still other embodiments, multiple different probe head assemblies can be used, e.g., one probe head assembly with all test pad probe wires, and one probe head assembly with all bond pad probe wires. However, in such an embodiment, both probe head assemblies are designed for use with the same space transformer as will be described below.

Wire surface 325 is exposed and/or planarized so as to form adequate electrical contact with probe wire 336 and/or probe wire 338 when probe head assembly 330 is secured to the space transformer. Thus, unlike prior art vertical pin probing devices, one wire from space transformer 320 is designed to be electrically coupleable to two (or more) probe wires, i.e., one probe wire for use on a bond pad and one probe wire for use on a test pad. Such coupling can be simultaneous, i.e., when both types of probe wires are present in one location of a probe head assembly, or sequential, i.e., when two different probe head assemblies are used one after the other. Moreover, probe head assemblies are typically designed so that probe wires can be readily installed, repaired, or replaced. Thus, a particular probe head assembly might use a test pad probe wire in one location corresponding to a space transformer wire, and then be subsequently modified to use a bond pad probe wire in the same location corresponding to a space transformer wire. As shown in FIG. 3, space transformer 320 is attached to probe card 310 using screws, and an epoxy potting compound 322 immobilizes wire 324. Note also that the choice of which probe wires correspond to test pads and which correspond to bond pads (e.g., 336 or 338) is arbitrary, and generally depends on the location of such pads on the die under test.

Probe head assembly 330 includes first plate (surface) 332 with an array of holes for supporting multiple probe wires, and second plate 334 with a similar array of holes (possibly offset from the first surface holes, depending on probe wire type) for supporting opposing ends of the multiple probe wires. As shown in FIG. 3, the holes for opposite ends of the probe pins 336 and 338 are slightly offset from one another and the probe pins are curved in a snake-like configuration to promote buckling, so as to create substantially uniform contact pressure on an integrated circuit pad despite any slight vertical unevenness or misalignment. Once the probe head assembly 330 is attached to space transformer 320, an integrated circuit die can be brought into contact with the exposed ends of probe wires 336 and/or 338 for testing.

The wire probes are typically designed to include some spring section or resilience property so as to bias a probe tip when it comes into contact with a pad on an integrated circuit die. This biasing or spring effect helps minimize the amount of force brought to bear on the integrated circuit die, thereby reducing damage to the die. The use of fine-diameter wire for the wire probes typically enables a high-density array of probe wires to be provided by probe head assembly 330. When vertical pin probing device 300 is lowered onto a die (or vice versa), probe tips contact the bonding pads on the die to provide an electrical connection. Further downward force is absorbed by the spring sections of the formed wire probes. Conductive trace 312 and/or other traces on probe card 310 connect the formed wire probes to outer vias (not shown) to which a test controller transmits and receives signals for integrated circuit testing.

For clarity, FIG. 3 illustrates only one contact wire 324 and three sets of wire probes in probe head assembly 330. However, a typical vertical pin probing device will have numerous probe wires and corresponding space transformer wires to accommodate the pads of the integrated circuit under test. In some embodiments where every integrated circuit die bonding pad has a corresponding test pad, there will be two complete sets of wire probes. In still other embodiments, some locations on the probe head assembly will have only one or the other of a probe wire for a test pad and a probe wire for the corresponding bond pad. Thus, any location on probe head assembly 330 can have corresponding to a space transformer wire: only a probe wire for a test, only a probe wire for the corresponding bond pad, both, or neither. Moreover, probe head assembly 330 is typically designed for relatively easy installation, removal, and replacement of probe wires. The layout of various bond pad and test pad probe wires can therefore be arbitrarily arranged to accommodate any particular integrated circuit die.

Figure 4:
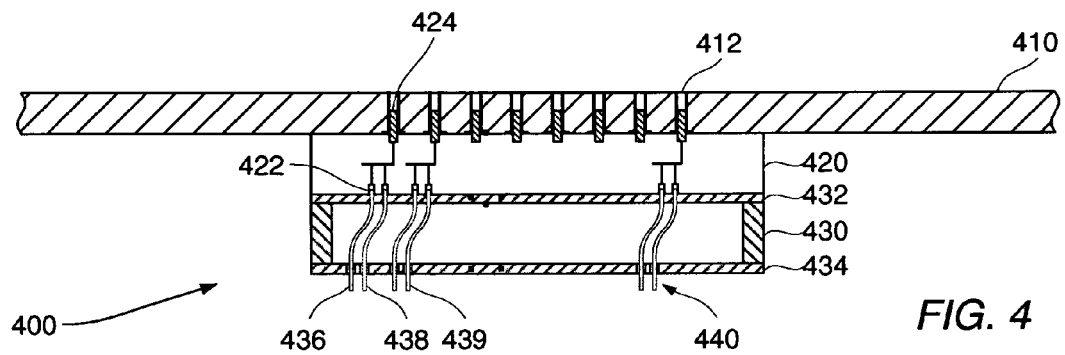
FIG. 4 illustrates a cross-sectional view of another embodiment of the present invention.

FIG. 4 illustrates another embodiment of a vertical pin probing device, 400. Like vertical pin probing device 300, vertical pin probing device 400 includes a probe card or PCB 410, a space transformer 420 and a probe head assembly 430.

Probe card 410 is similar in construction to probe card 310 of FIG. 3. Probe card 412 includes vias 412 for connection to test probes of a device tester or to a mother board. Alternately, probe card 410 can include various conductive traces (e.g., surface traces or PCB layer traces) for carrying signals from vias 412 to integrated circuit test equipment (not shown). For example, such conductive traces lead to other contacts, e.g., pogo pads, on the printed circuit board to which the external test equipment leads are connected in a prescribed test.

Probe head assembly 430 is coupled to space transformer 420 which in turn is coupled to probe card 410. Although not shown, probe head assembly 430 and space transformer 420 are typically coupled to each other and/or to probe card 410 using a mechanical fastener such as a screw. Space transformer 420 includes a plurality of pins 424, each of which is electrically connected to a unique one of vias 412 when the space transformer is joined with probe card 410. Space transformer 420 also includes various sockets 422 to receive probe wire ends. Pins 424 of space transformer 420 provide a relatively large and robust interface structure for electrically coupling space transformer 420 to probe card 410, thereby reducing the possibility of damage to the more fragile probe wires (436 and 438) of probe head assembly 430. However, in the event that one or more of the wire probes 436 and 438 are damaged, probe head assembly 430 can be detached from space transformer 420 for offline repair, while a replacement probe assembly can be installed to minimize testing downtime.

In general, space transformer 420 provides pitch reduction, high density routing, and even signal conditioning such as mid-frequency decoupling through the use of decoupling capacitors (not shown). Moreover, space transformer 420 can be constructed using various known PCB fabrication techniques. As shown, space transformer 420 is designed to electrically couple pairs of probe wires, e.g., probe wires 436 and 438, that correspond to test/bond pad probe pairs. This electrical coupling is achieved using a common conductor within the body of space transformer 420, but could also be implemented using surface contacts. Additionally, the electrical coupling of pairs of wire probes can instead be accomplished on probe card 410. For example, instead of a space transformer pin 424 corresponding to two probe wires, each probe wire can have its own pin. Probe card 410 would then be configured to receive a greater number of pins and to short together certain pins using surface conductive traces and/or conductive traces within the layers of probe card 410. In still another embodiment, probe head assembly 430 is mounted directly onto probe card 410, and probe wire tips are received in suitable sockets formed in probe card 410. In such an implementation, probe card 410 would typically be designed (as described above) to provide the desired electrical continuity between certain probe wires.

Like vertical pin probe device 300, vertical pin probe device 400 is configured to be electrically coupleable to two (or more) probe wires, i.e., one probe wire for use on bond pad and one probe wire for use on a test pad, in order to take full advantage of integrated circuit die having multiple types of pads. Thus, probe wire 438 is shown in FIG. 4 using dashed lines because in one embodiment, a particular probe head assembly location has only one or the other of probe wires 436 and 438. For example, probe head assembly 430 can include some locations where only a test pad probe wire is located (e.g., 436), and other locations where only a bond pad probe wire is located (e.g., 439). In other embodiments, one or more locations in the probe head assembly will have both types of probe wire, e.g., probe wire pair 440. In still other embodiments, multiple different probe head assemblies can be used, e.g., one probe head assembly with test pad probe wires, and one probe head assembly with bond pad probe wires. However, in this example both probe head assemblies are designed for use with the same space transformer.

To that end, probe head assembly 430 is similar to probe head assembly 330 and includes first plate (surface) 432 with an array of holes for supporting multiple probe wires and second plate 434 with a similar array of holes (possibly offset from the first surface holes, depending on probe wire type) for supporting opposing ends of the multiple probe wires. The surface holes are clearance holes designed to accommodate a plurality of preformed wire probes (436, 438) which are fixedly mounted. Each wire probe includes a tip that extends through one of the clearance holes of second plate 434 to accurately position wire probe tips for integrated circuit die testing. The other end of each wire probe extends through first surface 432 and is received by a corresponding socket 422. Probe head assembly 430 is constructed to allow vertical motion of the probe wire tips. Because of the fine diameter of probe wires, a very dense pattern of probe tips can be provided. For example, tip-to-tip spacing can range from 0.5 mm to 0.13 mm.

As shown in FIG. 4, the holes for opposite ends of the probe pins 436 and 438 are slightly offset from one another and the probe pins are curved in a snake-like configuration to promote buckling, so as to create substantially uniform contact pressure on an integrated circuit pad despite any slight vertical unevenness or misalignment. The wire probes are typically designed to include some spring section or resilience property so as to bias a probe tip when it comes into contact with a pad on an integrated circuit die. This biasing or spring effect helps minimize the amount of force brought to bear on the integrated circuit die, thereby reducing damage to the die. Conductive trace and/or other traces on probe card 410 connect the formed wire probes to outer vias (not shown) to which a test controller transmits and receives signals for integrated circuit testing.

In other embodiments, an interposer (not illustrated) can be inserted between a space transformer and a corresponding probe card. Interposers typically include a substrate and a plurality of resilient interconnection elements mounted on both sides of the substrate to provide resilient interconnection between the space transformer and the probe card. Various different spring shapes are suitable for the resilient interconnection elements, and the interconnection elements are generally arranged at a pitch which matches that of corresponding terminals on each of the space transformer and the probe card. Such interposers are used, for example, to provide additional flexibility in orienting a space transformer and/or probe head assembly while maintaining adequate electrical contact with a probe card.

In still other embodiments, functionality of a space transformer and a probe head assembly can generally be combined into a specialized space transformer. For example, such as specialized space transformer can include a suitable circuitized substrate (e.g., a PCB substrate) having a plurality of terminals (e.g., sockets, pins, contact areas, or pads) located on one side of the space transformer and oriented for interconnection with a suitably configured probe card. On the opposite side of the specialized space transformer, a plurality of probes are positioned for contact with integrated circuit die. In this example, the terminals are disposed at the pitch of corresponding interconnection elements of the probe card, while the probes are arranged at a finer (closer) pitch corresponding to the layout of test and bond pads of an integrated circuit die.

Such probes are designed to be resilient (like those illustrated in FIGS. 3 and 4) for the many reasons described above. The probes can be mounted indirectly or directly (i.e., without the intermediary of additional materials such as wires connecting the probe elements to the terminals, or brazing or soldering the probe elements to the terminals) to corresponding terminals on the specialized space transformer. Such probes are typically arranged so that their probe tips are spaced at an even finer pitch than the ends attached to the specialized space transformer, thereby augmenting the pitch reduction. Moreover, these probes can be formed from wire, fabricated on a sacrificial substrate and subsequently individually mounted (e.g. using MEMs techniques), or the like. The may also take a variety of different shapes and orientations such as a cantilevered orientation.

Figure 5A:
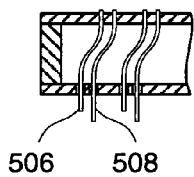
FIGS. 5A–5C illustrate several examples of test pin configurations.
Figure 5B:
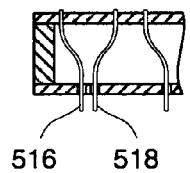
Figure 5C:
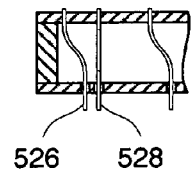
Figure 6A:
Figure 6B:
Figure 6C:
Figure 6D:
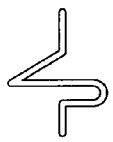
Figure 6E:

As noted above, many embodiments will include probe head assembly locations having probes or probe wires for both a bond pad and an associated test pad. Because of the close proximity of the probes or probe wires, and because of the variety of different die pad layouts that might need to be accommodated, it may be desirable to implement a variety of different probe lengths, orientations, and configurations. FIGS. 5A–5C illustrate several probe embodiments. In the examples illustrated, two different types of probe wires are shown next to each other in the same probe head assembly. As note above, such probe wires need not be installed in the same probe head assembly at the same time.

FIG. 5A illustrates a portion of a probe head assembly having two related wire probes 506 and 508 (e.g., one for a bond pad and one for a test pad) with differing lengths. Differing lengths might be useful where, for example, it is desirable to ensure probe contact with test pads well before probe contact with bond pads. Moreover, if it is desirable to ultimately allow the test pad probe to make contact with the test pad, the die can be moved closer to the probe head assembly (or vice versa) to allow such contact. Other features that might differ between probe wires include: probe tip features (surface, shape, etc.), probe material, probe shape, and the like.

FIGS. 5B and 5C illustrate examples where "related" probe wires are oriented in different ways to, for example, conserve space, prevent shorting, maximize room for probe flexing, and the like. Probe wires 516 and 518 have the same shape, but are oppositely arranged. Similarly, probe wires 526 and 528 have the same shape but are arranged at right angles to each other, i.e., the plane of probe wire 528 is in/out of the page. Numerous other orientations and arrangements will be known to those having ordinary skill in the art. Additionally, different portions of a probe head assembly can utilize different probe wire features, orientations, and arrangements.

As illustrated in FIGS. 3–5C, the probe wires in a pair of probe wires corresponding to a test/bond pad pair will generally have to be very close to each other. In some instances, it may be impractical to include both a test pad probe wire and a corresponding bond pad probe wire in the same probe head assembly. In such instances, two different probe head assemblies can be used: one including some (or all) of one type of probe wire, and one including corresponding ones of the other type of probe wire. Thus, the space transformer (or probe card designed to attach directly to the probe head assembly) can be implemented as described above, or can be further simplified. For example, the two different probe head assemblies can include corresponding test and bond probe wires that emerge from the probe head assemblies at locations corresponding to the test and bond pads, while the opposite ends of the two probe wires emerge from their respective probe head assemblies at the same (or approximately the same) location, thereby allowing a smaller space transformer wire (FIG. 3) or a single space transformer terminal (FIG. 4) to accommodate both probe wires of the two different probe head assemblies. In other embodiments, the probe head assemblies can be configured such that the space transformer side of the probe wires for the two different probe head assemblies are generally closer than could otherwise be achieved in a single probe head assembly.

FIGS. 6A–6E illustrate some of the many possible shapes probe wires can take. Probe wires can be formed from a unitary piece of material (e.g., a wire), or a composite of a core material and one or more outer coatings. For example, the core might be a comparatively soft core (e.g., readily shaped and amenable to affixing by common processes to electronic components) overcoated by one or more harder materials that provide resilience or springiness. Such harder "shells" can be applied by suitable plating or deposition processes.

The probe wire deflection under force is determined in part by the materials used to form the probe wire and in part by the shape of the probe wire. Certain shapes may provide only a small amount of probe deflection, while other shapes may be capable of providing greater deflection. Similarly, some shapes may provide greater probe longevity than others. Still other shapes may be selected to enhance connectivity to die pads. For example, a shape may be selected so that a force applied by a pad of an electronic component to which the probe is making a pressure contact, causes the probe tip to move across the pad in a "wiping" motion. Such a wiping contact can provide more reliable contact in some circumstances.

The shapes shown in FIGS. 6A–6E are merely illustrative, and numerous other shapes will be known to those having ordinary skill in the art. Similarly, various different probe wire material compositions and fabrication techniques will also be known to those having ordinary skill in the art.

Additionally, while the disclosed devices and techniques have been described in light of the embodiments discussed above, one skilled in the art will also recognize that certain substitutions may be easily made in the circuits without departing from the teachings of this disclosure. Various changes and modifications may be suggested to one skilled in the art and it is intended that the present invention encompass such changes and modifications that fall within the scope of the appended claims.

The invention claimed is:

1. An apparatus comprising:
   a substrate comprising a probe card;
   a first plurality of probe wires coupled to the substrate, wherein the first plurality of probe wires are arranged with respect to the substrate to correspond to a first plurality of pads of an integrated circuit; and
   a second plurality of probe wires coupled to the substrate, wherein the second plurality of probe wires are arranged with respect to the substrate to correspond to a second plurality of pads of the integrated circuit, and wherein the first plurality of pads of an integrated circuit are test pads and the second plurality of pads of an integrated circuit are bond pads, each of the first plurality of pads being in electrical communication with one of the second plurality of pads, and wherein at least one of the first plurality of probe wires is electrically coupled to at least one of the second plurality of probe wires.

2. The apparatus of claim 1 wherein the substrate further comprises:
   a first plate including a first plurality of through holes; and
   a second plate including a second plurality of through holes, wherein the first plurality of probe wires and the second plurality of probe wires are coupled between the first plate and the second plate, wherein at least one of the first plurality of probe wires is at least partially held in place by corresponding ones of the first plurality of through holes and the second plurality of through holes, and wherein at least one of the second plurality of probe wires is at least partially held in place by corresponding ones of the first plurality of through holes and the second plurality of through holes.

3. The apparatus of claim 1 wherein the substrate further comprises:
   a first surface including a plurality of conductive terminals; and
   a second surface opposing the first surface, wherein the first plurality of probe wires is coupled to the second surface, wherein the second plurality of probe wires is coupled to the second surface, and wherein at least one of the first plurality of probe wires or at least one of the second plurality of probe wires is electrically coupled to at least one of the plurality of conductive terminals.

4. The apparatus of claim 3 wherein the at least one of the first plurality of probe wires and the at least one of the second plurality of probe wires are both electrically coupled to one of the plurality of conductive terminals.

5. The apparatus of claim 1 further comprising:
   a space transformer coupled to the substrate and configured to make electrical contact with at least one of the first plurality of probe wires and at least one of the second plurality of probe wires.

6. The apparatus of claim 5, wherein the probe card is coupled to the space transformer and configured to electrically couple the space transformer, the at least one of the first plurality of probe wires, and the at least one of the second plurality of probe wires to a test controller operable to transmit and receive test signal for integrated circuit testing.

7. The apparatus of claim 5 wherein the space transformer further comprises:
   a first surface including a plurality of pins; and
   a second surface including a plurality of sockets, wherein a first one of the plurality of sockets is coupled to the at least one of the first plurality of probe wires, and wherein a second one of the plurality of sockets is coupled to the at least one of the second plurality of probe wires.

8. The apparatus of claim 7 wherein the at least one of the first plurality of probe wires coupled to the first one of the plurality of sockets and the at least one of the second plurality of probe wires coupled to the second one of the plurality of sockets are electrically coupled to each other.

9. The apparatus of claim 5 wherein the space transformer further comprises:
   a wire operable to be connected to the probe card, wherein the wire includes a wire surface oriented to make electrical contact with the at least one of the first plurality of probe wires and the at least one of the second plurality of probe wires.

10. The apparatus of claim 1 wherein at least one of the first plurality of probe wires is longer than at least one of the second plurality of probe wires.

11. The apparatus of claim 1 wherein at least one of the second plurality of probe wires is located in proximity to a corresponding one of the first plurality of probe wires.

12. The apparatus of claim 1 wherein at least one of the first plurality of probe wires has a shape different from that of at least one of the second plurality of probe wires.

13. The apparatus of claim 1 wherein at least one of the first plurality of probe wires and at least one of the second plurality of probe wires each have a spring section.

14. The apparatus of claim 1 wherein at least one of the first plurality of probe wires and at least one of the second plurality of probe wires each possess a resilient property.

15. The apparatus of claim 1 wherein at least one of the first plurality of probe wires is not electrically connected any of the second plurality of probe wires.

16. The apparatus of claim 1 wherein at least one of the first plurality of probe wires is oriented in a first direction, and at least one of the second plurality of probe wires is oriented in a second direction.

17. A method of probing an integrated circuit die having a bond pad and a test pad electrically connected to the bond pad, the method comprising:
contacting a first probe wire with the test pad; and
contacting a second probe wire with the bond pad; and
shorting the first probe wire to the second probe wire.

18. The method of claim 17 further comprising:
transmitting a test signal to the integrated circuit die via at least one of the first probe wire and the second probe wire.

19. The method of claim 17 further comprising:
receiving a test signal from the integrated circuit die via at least one of the first probe wire and the second probe wire.

20. The method of claim 17 wherein the shorting the first probe wire to the second probe wire further comprises:
contacting a first end of the first probe wire and a first end of the second probe wire with a wire surface of a test wire.

21. The method of claim 17 wherein the shorting the first probe wire to the second probe wire further comprises:
contacting a first end of the first probe wire with a first conductor;
contacting a first end of the second probe wire with a second conductor; and
electrically coupling the first conductor to the second conductor.

22. The method of claim 17 wherein the contacting a first probe wire with a first pad of an integrated circuit die further comprises resiliently flexing the first probe wire, and wherein the contacting a second probe wire with a second pad of an integrated circuit die further comprises resiliently flexing the second probe wire.

23. An apparatus comprising:
a means for contacting a first probe means with a first pad of an integrated circuit die; and
a means for contacting a second probe means with a second pad of the integrated circuit die; and
means for electrically coupling together the first probe means to the second probe means;
wherein the first pad of the integrated circuit die is a first test pad or a first bond pad, wherein the second pad of the integrated circuit die is a second test pad or a second bond pad, and wherein the first test pad is electrically coupled to the first bond pad.

24. The apparatus of claim 23 further comprising:
a means for transmitting a test signal to the integrated circuit die via at least one of the first probe means and the second probe means.

* * * * *